United States Patent
Pham et al.

(10) Patent No.: US 6,605,511 B2
(45) Date of Patent: Aug. 12, 2003

(54) METHOD OF FORMING NITRIDATED TUNNEL OXIDE BARRIERS FOR FLASH MEMORY TECHNOLOGY CIRCUITRY AND STI AND LOCOS ISOLATION

(75) Inventors: Tuan Duc Pham, Santa Clara, CA (US); Mark T. Ramsbey, Sunnyvale, CA (US); Yu Sun, Saratoga, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/295,738

(22) Filed: Nov. 15, 2002

(65) Prior Publication Data

US 2003/0073288 A1 Apr. 17, 2003

Related U.S. Application Data

(62) Division of application No. 09/491,457, filed on Jan. 26, 2000, now Pat. No. 6,509,604.

(51) Int. Cl.⁷ .................................. H01L 21/8234
(52) U.S. Cl. .................. 438/275; 438/211; 438/258; 438/981; 438/264; 257/316; 257/321; 257/506
(58) Field of Search ................. 438/211, 275, 438/258, 981, 257, 283, 197, 264; 257/316, 321, 506

(56) References Cited

U.S. PATENT DOCUMENTS

| | | | |
|---|---|---|---|
| 5,658,812 A | 8/1997 | Araki | |
| 5,712,205 A | 1/1998 | Park et al. | |
| 5,858,830 A | 1/1999 | Yoo et al. | |
| 6,004,862 A | 12/1999 | Kim et al. | |
| 6,080,682 A | * 6/2000 | Ibok | 438/770 |
| 6,121,116 A | * 9/2000 | Sung | 438/452 |
| 6,184,093 B1 | * 2/2001 | Sung | 438/275 |
| 6,284,602 B1 | * 9/2001 | He et al. | 438/258 |

FOREIGN PATENT DOCUMENTS

| | | |
|---|---|---|
| EP | 0 751 560 A1 | 2/1997 |
| JP | 7-111288 | 4/1995 |

* cited by examiner

*Primary Examiner*—Amir Zarabian
*Assistant Examiner*—Rhanh Dvong
(74) *Attorney, Agent, or Firm*—LaRiviere, Grubman & Payne, LLP

(57) ABSTRACT

A method of fabricating an improved flash memory device, having shallow trench isolation in the periphery region and LOCOS isolation in the core region is provided, by first creating the shallow trench isolation using a hard mask; then creating the LOCOS isolation; and subsequently etching to remove stringers. The flash memory is able to use shallow trench isolation to limit encroachment. The flash memory may also have a nitridated tunnel oxide layer. A hard mask is used to prevent nitride contamination of the gate oxide layer.

9 Claims, 8 Drawing Sheets

US 6,605,511 B2

METHOD OF FORMING NITRIDATED TUNNEL OXIDE BARRIERS FOR FLASH MEMORY TECHNOLOGY CIRCUITRY AND STI AND LOCOS ISOLATION

CROSS-REFERENCE TO RELATED APPLICATION

This application is a divisional application of, and claims priority from, U.S. Pat No. 09/491,457, entitled NITRIDATED TUNNEL OXIDE BARRIERS FOR FLASH MEMORY TECHNOLOGY CIRCUITRY AND STI AND LOCOS ISOLATION, filed Jan. 26, 2000, by the same applicants.

FIELD OF THE INVENTION

The present invention relates to nonvolatile memory devices. Even more particularly, the present invention relates to flash memory utilizing periphery and core stacks.

BACKGROUND OF THE INVENTION

Memory devices such as flash memory or electrically erasable programmable read only memory (EEPROM) are known. Memory devices such as flash memory comprise, core stacks, which hold the erasable programmable data, and periphery stacks which are used to program the core stacks. Manufacturing periphery stacks and core stacks on the same chip is advantageous and is done in the related art. However, sometimes using local oxidation of silicon (LOCOS) on part of the flash memory and shallow trench isolation (STI) on other parts of the flash memory is desirable. For instance, where shallow trench isolation is used for the periphery stacks, corner recesses, which are detrimental to the periphery stacks, form around the shallow trench isolation. In addition, core stacks and periphery stacks require different manufacturing steps. Some of these different processing steps for the core stacks are harmful to the periphery stacks and vice versa. One example of these problems is related to the use of a nitrogen implant or other nitridation methods to improve the functionality of the tunnel oxide of the core stacks. In the related art, such a nitrogen implant tends to contaminate the gate oxide of the periphery stack, thereby diminishing the performance of the gate oxide. Manufacturing periphery stacks and core stacks on a single chip is desirable. Thus, minimizing damage to the periphery stacks and core stacks from the different processes required to manufacture the different stacks is also desirable. Also, having periphery stacks with gate oxides of different thicknesses is a desirable condition.

BRIEF SUMMARY OF THE INVENTION

Accordingly, the present invention involves the use of successive hard masks to provide STI and LOCOS isolation on a single chip and the fabrication of a flash memory device on a substrate by using a hard mask to protect the periphery before forming a nitridated tunnel oxide. Advantages of the present invention include the capability of fabricating a plurality of semiconductor devices on a single chip, wherein some of the devices are separated by shallow trench isolation and other devices are separated by local oxidation of silicon, the capability of fabricating a flash memory with a reduced contamination of the gate oxide, and the capability of fabricating a flash memory device with improved stack isolation. Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the below-referenced accompanying drawings. Reference numbers refer to the same or equivalent parts of the present invention throughout the several figures of the drawing.

DETAILED DESCRIPTION OF THE INVENTION AND BEST MODE OF THE INVENTION

Figure 1:
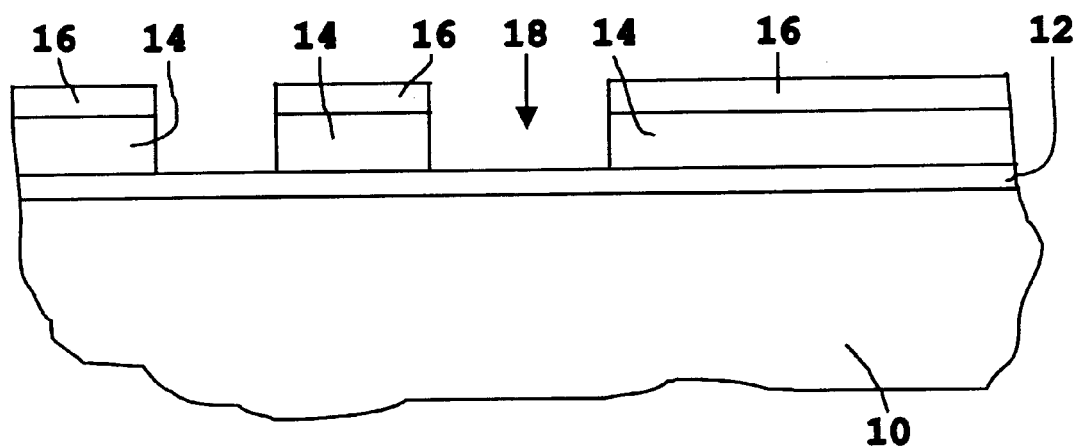
FIG. 1 is a cross sectional view of a semiconductor substrate used in a preferred embodiment of the present invention.

FIG. 1 is a cross sectional view of a semiconductor substrate 10 used in a preferred embodiment of the invention. A pad oxide layer 12 is formed over a surface of the semiconductor substrate 10. A 1000-Å to 2000-Å first hard mask layer 14 is formed over the pad oxide layer 12. In the preferred embodiment of the invention, the first hard mask layer 14 is a material selected from a group consisting of silicon oxynitride (SiON), silicon nitride ($Si_3N_4$), and polysilicon (poly-Si). A photoresist mask 16 is formed over the first hard mask layer 14. Regions of the first hard mask layer 14 that are not covered by the photoresist mask 16 are etched away to form apertures 18 in the first hard mask layer 14. In this embodiment, the apertures 18 are disposed only over the periphery region and interface region of the semiconductor substrate 10.

Figure 2:
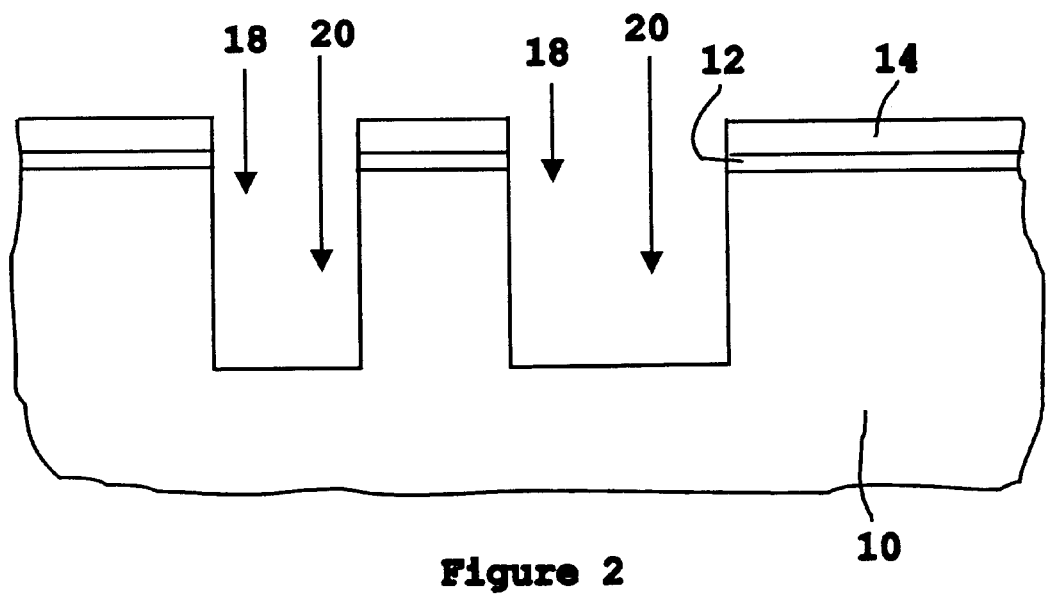
FIG. 2 is a cross sectional view of the substrate shown in FIG. 1, with trenches.
Figure 3:
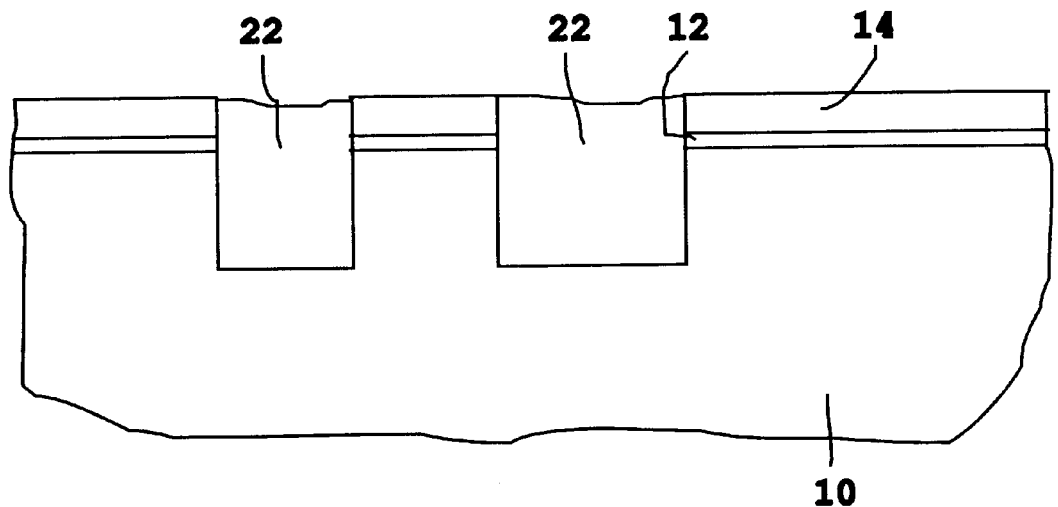
FIG. 3 is a cross sectional view of the substrate shown in FIG. 2, with a trench oxide.

The photoresist mask 16 is removed; and the semiconductor substrate 10 is subjected to an etch, which creates shallow trenches 20 in the semiconductor substrate 10 below the apertures 18 in the first hard mask layer 14, as shown in FIG. 2. In the preferred embodiment, the depth of the trenches 20 into the substrate 10 surface is in a range of approximately 0.15 µm to 0.35 µm. A trench oxide 22 is formed in the trenches 20, as shown in FIG. 3.

Figure 4:
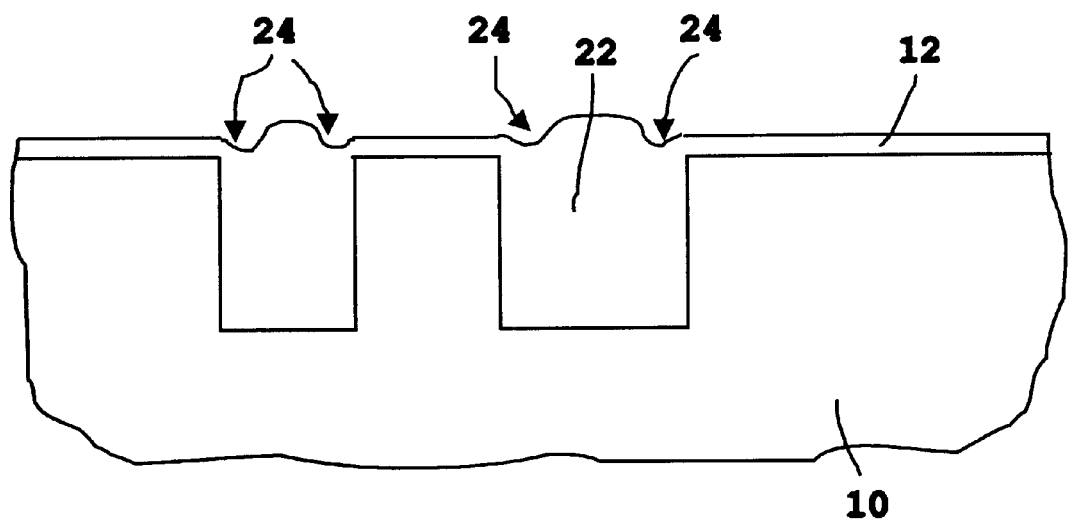
FIG. 4 is a cross sectional view of the substrate shown in FIG. 3, with corner recesses.

The semiconductor substrate 10 is then subjected to an etch for removing the first hard mask layer 14, as shown in FIG. 4. In the preferred embodiment, the substrate 10 is then subjected to a cleaning step. The top of the trench oxide 22 has corner recesses 24 greater than about 50 Å deep. In the related art, such corner recesses could be severely extended below the silicon surface.

Figure 5:
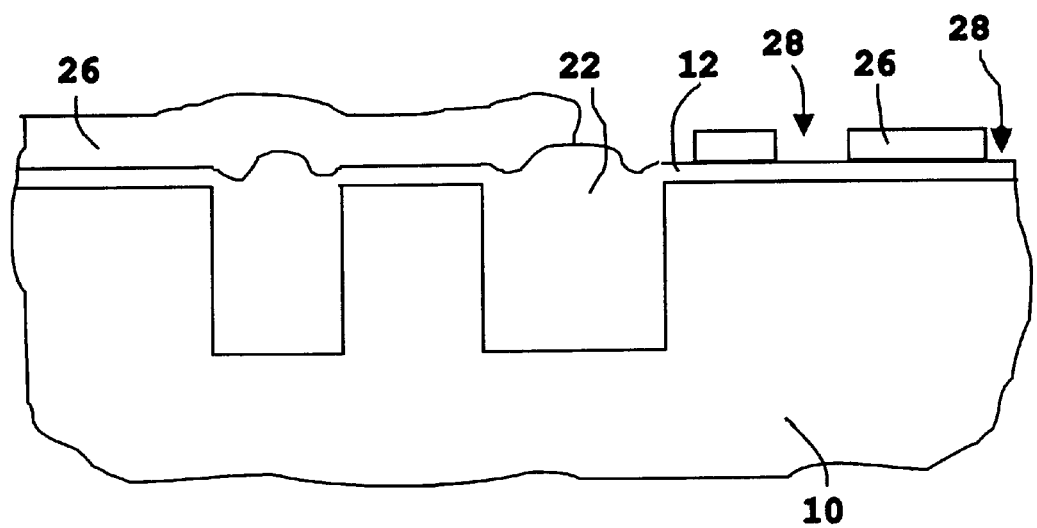
FIG. 5 is a cross sectional view of the substrate shown in FIG. 4, before LOCOS.

A second hard mask 26, which in the preferred embodiment is about 1000-Å to 2000-Å thick is formed over the surface of the trench oxide 22 and pad oxide 12, as shown in FIG. 5. In the preferred embodiment of the invention, the second hard mask 26 is a material selected from a group consisting of silicon oxynitride (SiON), silicon nitride ($Si_3N_4$) and polysilicon (poly-Si). A photoresist mask (not shown) is used to form apertures 28 in the second hard mask 26 over the core region and interface region of the substrate 10. The photoresist mask (not shown) is then removed. The semiconductor substrate 10 is subjected to a clean step to remove greater than about 30 Å of oxide.

Figure 6:
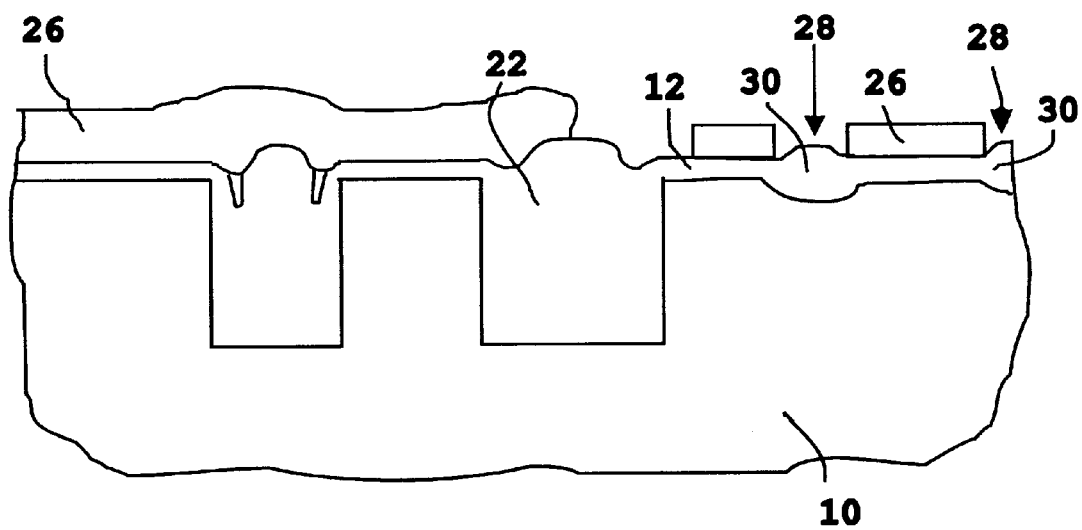
FIG. 6 is a cross sectional view of the substrate shown in FIG. 5, with LOCOS.
Figure 7:
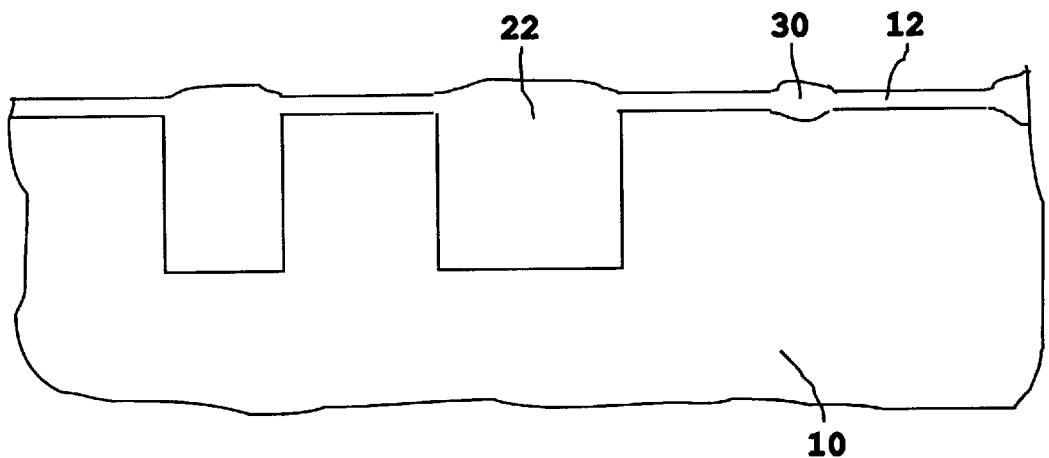
FIG. 7 is a cross sectional view of the substrate shown in FIG. 6, after the removal of the hard mask used for LOCOS.

The semiconductor substrate 10 is then subjected to a low temperature oxidation at about 1050° C. to form LOCOS oxides 30, as shown in FIG. 6. The second hard mask 26 is then removed, and the remaining oxides 12,22,30 are subjected to a cleaning step using hydrofluoric acid (HF) to remove any remaining stringers in the oxide, as shown in FIG. 7. The semiconductor substrate 10 has a STI and a LOCOS isolation on a single substrate 10 and is ready for the manufacture of periphery and core stacks between the LOCOS oxides 30 and the trench oxide 22.

Figure 8:
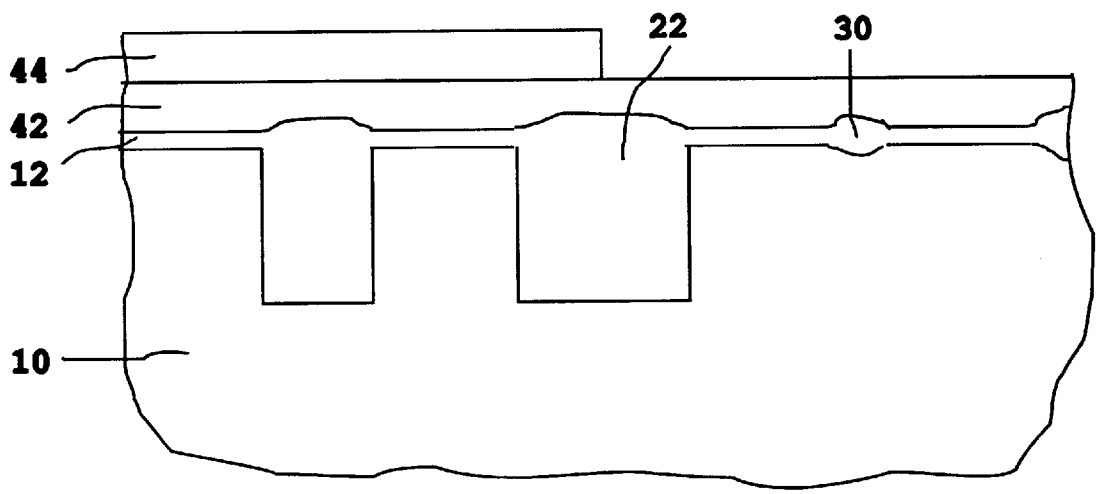
FIG. 8 is a cross sectional view of the substrate shown in FIG. 7, with a hard mask layer.

To begin the manufacture of the periphery and core stacks, a 100-Å to 500-Å third hard mask layer 42 is placed on the pad oxide 12 over both the periphery region and core region, as shown in FIG. 8. In the preferred embodiment of the invention, the third hard mask layer 42 is material selected from a group consisting of silicon oxynitride (SiON), silicon nitride ($Si_3N_4$), and polysilicon (poly-Si). A photoresist layer (not shown) is placed over the top surface of the third hard mask layer 42 and then etched back to form a photoresist mask 44 that does not cover the core section of the semiconductor substrate 10, as shown in FIG. 8. The trench oxide 22, pad oxide 12, and LOCOS oxide 30 are not drawn to scale so that more features may be shown in the figure.

Figure 9:
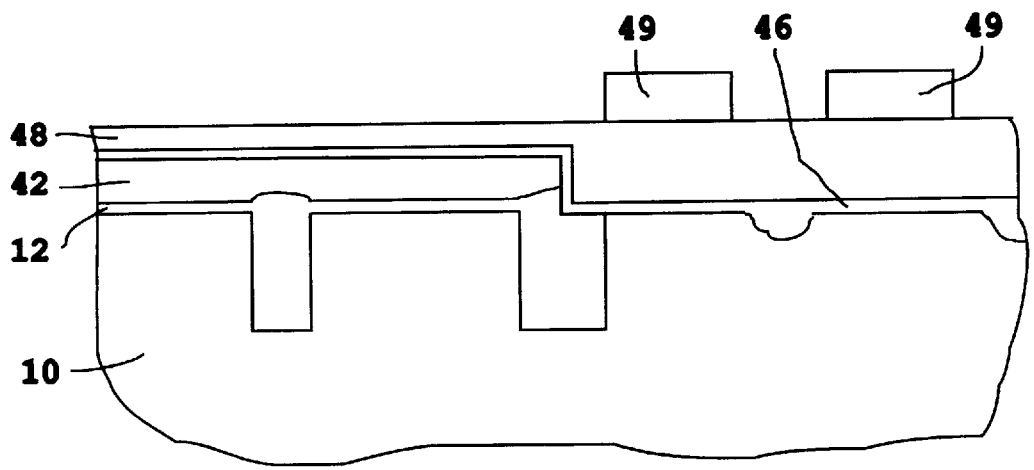
FIG. 9 is a cross sectional view of the substrate shown in FIG. 8, with a tunnel oxide and first polysilicon layer.

The semiconductor substrate 10 is subjected to an etching process, which removes the third hard mask layer 42 and the pad oxide 12 over the core region, as shown in FIG. 9. The photoresist mask 44 is then removed. A tunnel oxide layer 46 is formed over the core region. The tunnel oxide layer 46 may also be formed over the third hard mask layer 42. Various methods are known for forming the tunnel oxide layer 46, such as growing an oxide layer or depositing an oxide layer. In the preferred embodiment, the tunnel oxide layer 46 is nitridated (i.e., doping a tunnel oxide layer with nitrogen). Various methods are known for nitridating a tunnel oxide layer such as providing nitrous oxide ($N_2O$), nitric oxide (NO), and implanting nitrogen ($N_2$) into a tunnel oxide layer. A first polysilicon layer 48 is formed over the tunnel oxide layer 46. A photoresist mask 49 is placed over parts of the first polysilicon layer 48 over the core region.

Figure 10:
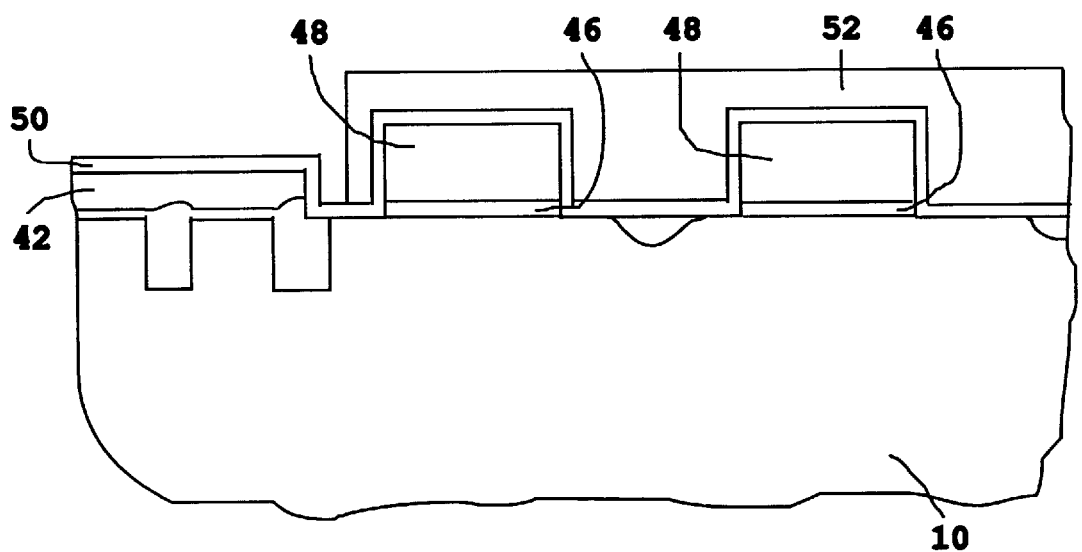
FIG. 10 is a cross sectional view of the substrate shown in FIG. 9, with an interpoly dielectric layer.

The semiconductor substrate 10 is subjected to an etching process, which removes parts of the first polysilicon layer 48 and tunnel oxide layer 46, as shown in FIG. 10. The photoresist mask 49 is removed. An interpoly dielectric layer 50 is formed over the substrate 10, third hard mask 42, and first polysilicon layer. In the preferred embodiment, the interpoly dielectric layer 50 is an oxide-nitride-oxide (ONO) layer. A photoresist mask 52 is formed over the interpoly dielectric layer 50 over the core region.

Figure 11:
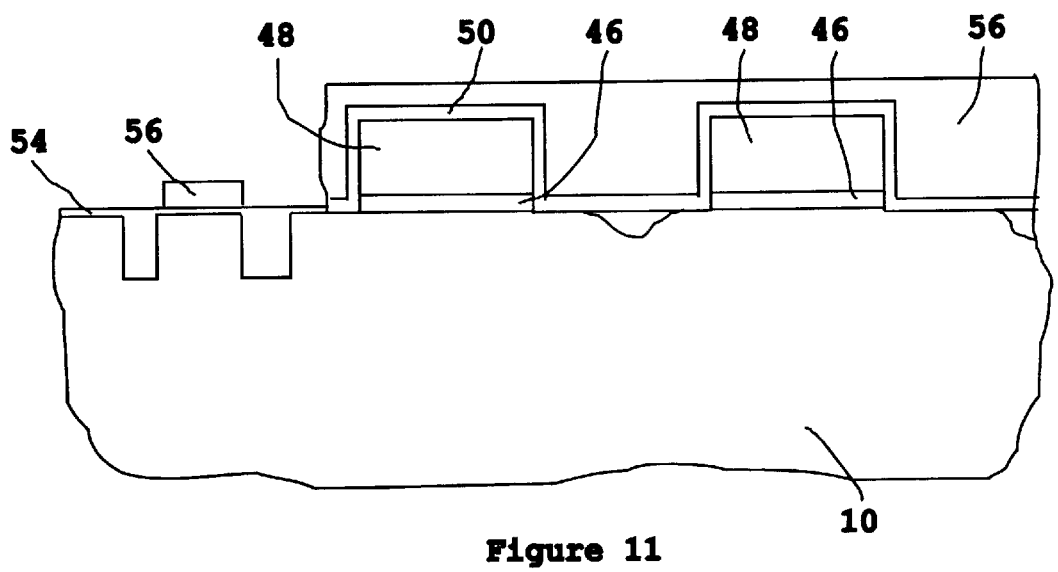
FIG. 11 is a cross sectional view of the substrate shown in FIG. 10, with a first gate oxide layer.

The semiconductor substrate 10 is then subjected to a two-step etch that (1) first removes the portion of the interpoly dielectric layer 50 over the periphery region and (2) then removes the third hard mask 42 and the remaining pad oxide, as shown in FIG. 11. The photoresist mask 52 is then removed. The semiconductor substrate 10 is then subjected to a first thermal oxidation which forms a first gate oxide layer 54 over the semiconductor substrate 10 in the periphery region. In the preferred embodiment, the first gate oxide layer 54 is about 100 Å thick. A photoresist mask 56 is formed over portions of the first gate oxide layer 54 in the periphery region and over the interpoly dielectric layer 50.

Figure 12:
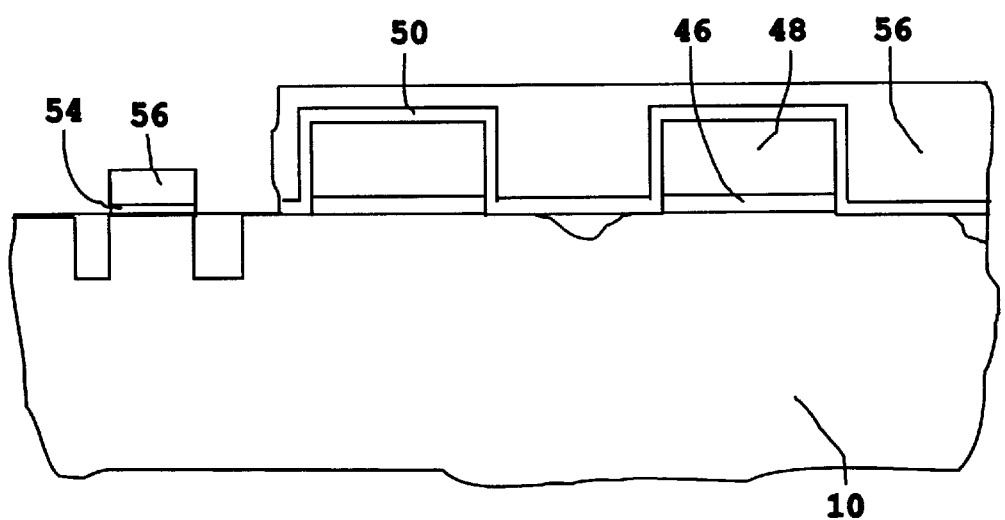
FIG. 12 is a cross sectional view of the substrate shown in FIG. 11, where the first gate oxide layer is etched back.
Figure 13:
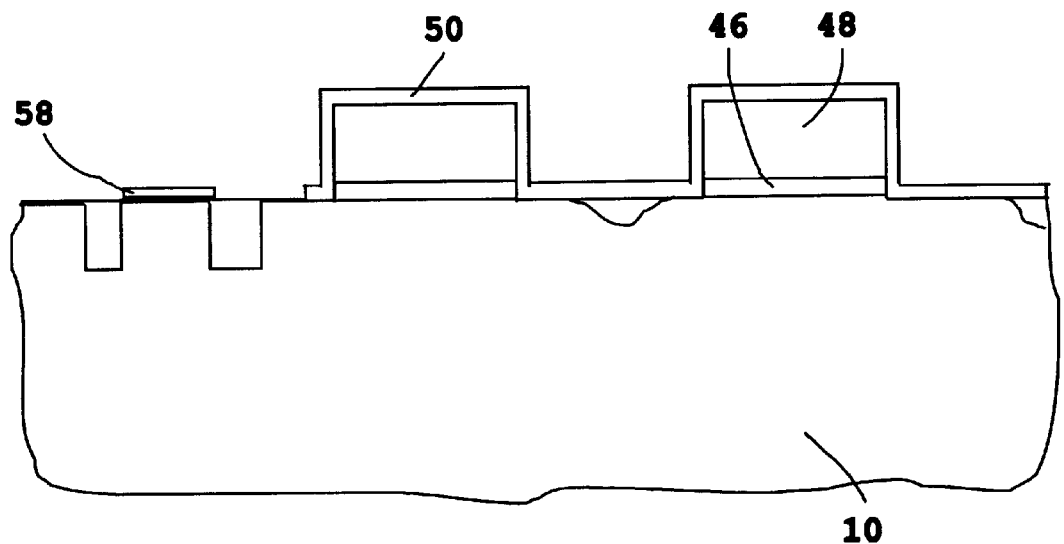
FIG. 13 is a cross sectional view of the substrate shown in FIG. 12, after the photoresist mask has been removed.
Figure 14:
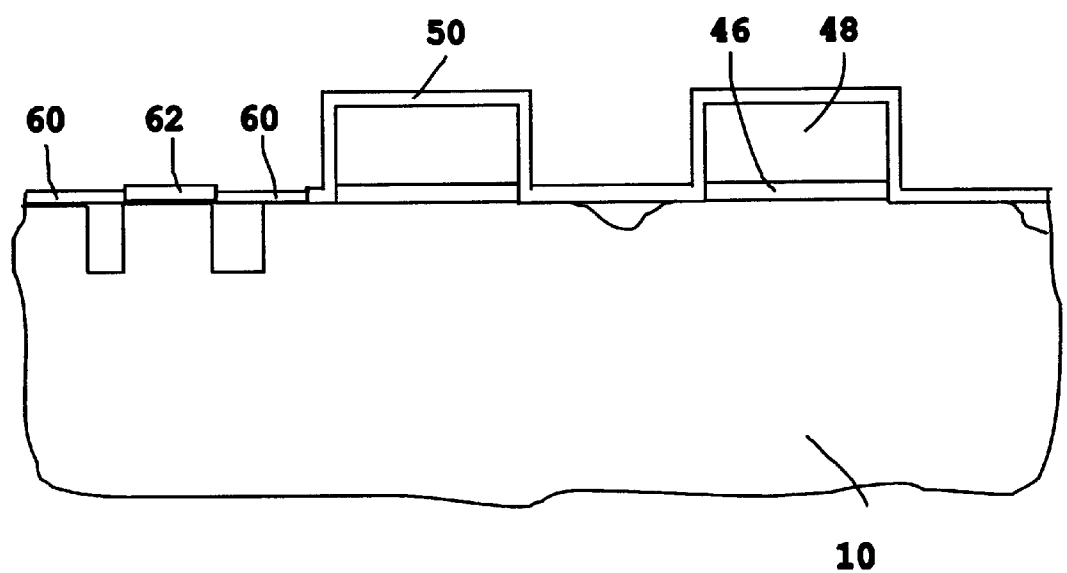
FIG. 14 is a cross sectional view of the substrate shown in FIG. 13, with thin and thick oxide layers.
Figure 15:
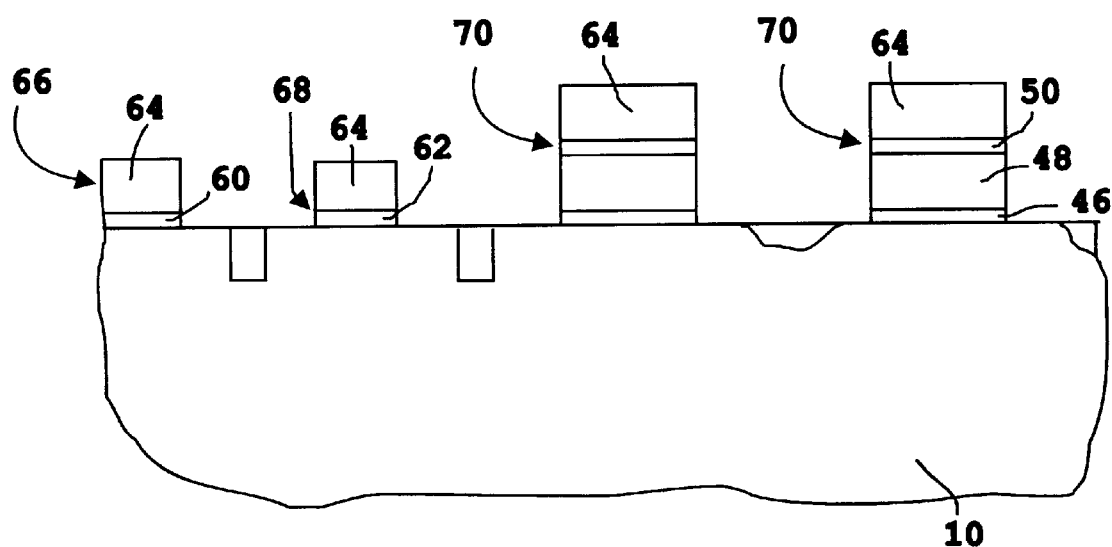
FIG. 15 is a cross sectional view of the substrate shown in FIG. 14, with periphery stacks and core stacks.

The parts of the first gate oxide layer 54 not covered by the photoresist mask 56 are etched away, as shown in FIG. 12. The photoresist layer 56 is then stripped away, as shown in FIG. 13 with the remaining first oxide layer 54 becoming the thick oxide regions 58. The semiconductor substrate 10 is then subjected to a second thermal oxidation, which forms thin oxide layers 60 in the uncovered regions of the substrate 10 and thick oxide layers 62 at the thick oxide regions 58, as shown in FIG. 14. In the preferred embodiment, the thin oxide layers 60 are 40 Å to 80 Å thick and the thick oxide layers 62 are 100 Å to 150 Å thick. A second polysilicon layer 64 is placed on the substrate 10, the thin oxide layers 60, the thick oxide layers 62, and the interpoly layer 50. The second polysilicon layer 64 is then etched back to form periphery stacks 66 with thin gates 60, periphery stacks 68 with thick gates 62, and core stacks 70, as shown in FIG. 15.

Conventional processes are then used to complete the flash memory structure. The inventive method allows the production of periphery gates 66 with thin gates 60 and periphery stacks 68 with thick gates 62 to provide gates having different threshold voltages. In addition, core stacks 70 with nitridated tunnel oxide layers are provided, without contaminating the gate oxide layers and allows the use of STI and LOCOS isolation on a single chip.

Information as herein shown and described in detail is fully capable of attaining the above-described object of the invention and is understood that it is the presently preferred embodiment of the present invention and is, thus, representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to be known to those of ordinary skill in the art are expressly incorporated herein by reference and are intended to be encompassed by the present claims. Moreover, a device or method need not address each and every problem sought to be solved by the present invention, for such problem to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for."

We claim:

1. A method of fabricating a semiconductor chip having a plurality of flash memory devices, comprising:

providing a silicon semiconductor substrate;

forming at least one periphery stack, comprising forming a thin gate oxide layer and forming at least one polysilicon (poly-Si) layer, on a periphery region only of said substrate, said thin gate oxide layer forming comprising forming said thin gate oxide layer as an un-nitridated thin gate oxide layer;

forming at least one periphery stack, comprising forming a thick gate oxide layer and forming at least one polysilicon (poly-Si) layer, on the periphery region only of said substrate, said thick gate oxide layer forming comprising forming said thick gate oxide layer as an un-nitridated thick gate oxide layer;

forming at least one core stack, comprising forming a nitridated tunnel oxide barrier layer, forming at least two polysilicon (poly-Si) layers, and forming an interpoly dielectric layer, on a core region only of said substrate;

forming at least one shallow trench isolation (STI) in the periphery region only of said substrate; and forming at least one local oxidation of silicon (LOCOS) isolation in the core region only of said substrate, said thick gate oxide layer forming step comprising forming said thick gate oxide layer to have a thickness distinct from that of said thin gate oxide layer in said thin gate oxide layer forming step.

2. A method, as recited in claim 1, wherein said un-nitridated thin gate oxide layer forming comprises forming said un-nitridated thin gate oxide layer to comprise at least one material selected from a group consisting essentially of thermal silicon oxide (SiO) and thermal silicon dioxide ($SiO_2$), and wherein said un-nitridated thin gate oxide layer forming comprises forming said un-nitridated thin gate oxide layer to comprise a thickness in a range of 40 Å to 80 Å.

3. A method, as recited in claim 1, wherein said un-nitridated thick gate oxide layer forming comprises forming said un-nitridated thick gate oxide layer to comprise at least one material selected from a group consisting essentially of thermal silicon oxide (SiO) and thermal silicon dioxide ($SiO_2$), and wherein said un-nitridated thick gate oxide layer forming comprises forming said un-nitridated thick gate oxide layer to comprise a thickness in a range of 100 Å to 150 Å.

4. A method, as recited in claim 1, wherein said nitridated tunnel oxide barrier layer forming comprises disposing said nitridated tunnel oxide barrier layer in the core region only and forming said nitridated tunnel oxide barrier layer to comprise at least one dopant selected from a group consisting essentially of nitrogen ($N_2$), nitrous oxide ($N_2O$), and nitric oxide (NO), and wherein said interpoly dielectric layer forming comprises forming said interpoly dielectric layer to comprise an oxide-nitride-oxide (ONO) layer.

5. A method, as recited in claim 1, wherein said at least one shallow trench isolation (STI) forming comprises forming said at least one STI to comprise a trench oxide, and wherein said at least one shallow trench isolation (STI) forming comprises forming said at least one STI to comprise a depth in a range of approximately 0.15 μm to approximately 0.35 μm.

6. A method, as recited in claim 1, wherein said at least one local oxidation of silicon (LOCOS) isolation forming comprises forming said at least one LOCOS isolation to comprise a LOCOS oxide, and wherein said at least one local oxidation of silicon (LOCOS) isolation forming comprises forming said at least one LOCOS isolation at a temperature of approximately 1050° C.

7. A method, as recited in claim 1, wherein each said at least one shallow trench isolation (STI) forming comprises insulating each said at least one periphery stack from one another.

8. A method, as recited in claim 1, wherein each said at least one local oxidation of silicon (LOCOS) isolation forming comprises insulating each said at least one core stack from one another.

9. A method of fabricating a semiconductor chip having a plurality of flash memory devices, comprising: providing a silicon semiconductor substrate;

forming at least one periphery stack, comprising forming a thin gate oxide layer and forming at least one polysilicon (poly-Si) layer, on a periphery region only of said substrate, said thin gate oxide layer forming comprising forming said thin gate oxide layer as an un-nitridated thin gate oxide layer;

forming at least one periphery stack, comprising forming a thick gate oxide layer and forming at least one polysilicon (poly-Si) layer, on the periphery region only of said substrate, said thick gate oxide layer forming comprising forming said thick gate oxide layer as an un-nitridated thick gate oxide layer;

forming at least one core stack, comprising forming a nitridated tunnel oxide barrier layer, forming at least two polysilicon (poly-Si) layers, and forming an interpoly dielectric layer, on a core region only of said substrate;

forming at least one shallow trench isolation (STI) in the periphery region only of said substrate; and forming at least one local oxidation of silicon (LOCOS) isolation in the core region only of said substrate, said thick gate oxide layer forming step comprising forming said thick gate oxide layer to have a thickness distinct from that of said thin gate oxide layer in said thin gate oxide layer forming step, wherein said un-nitridated thin gate oxide layer forming comprises forming said un-nitridated thin gate oxide layer to comprise at least one material selected from a group consisting essentially of thermal silicon oxide (SiO) and thermal silicon dioxide ($SiO_2$), wherein said un-nitridated thin gate oxide layer forming comprises forming said un-nitridated thin gate oxide layer to comprise a thickness in a range of 40 Å to 80 Å, wherein said un-nitridated thick gate oxide layer forming comprises forming said un-nitridated thick gate oxide layer to comprise at least one material selected from a group consisting essentially of thermal silicon oxide (SiO) and thermal silicon dioxide ($SiO_2$), wherein said un-nitridated thick gate oxide layer forming comprises forming said un-nitridated thick gate oxide layer to comprise a thickness in a range of 100 Å to 150 Å, wherein said nitridated tunnel oxide barrier layer forming comprises disposing said nitridated tunnel oxide barrier layer in the core region only and forming said nitridated tunnel oxide barrier layer to comprise at least one dopant selected from a group consisting essentially of nitrogen ($N_2$), nitrous oxide ($N_2O$), and nitric oxide (NO), wherein said interpoly dielectric layer forming comprises forming said interpoly dielectric layer to comprise an oxide-nitride-oxide (ONO) layer, wherein said at least one shallow trench isolation (STI) forming comprises forming said at least one STI to comprise a trench oxide, wherein said at least one shallow trench isolation (STI) forming comprises forming said at least one STI to comprise a depth in a range of approximately 0.15 $\mu$m to approximately 0.35 $\mu$m, wherein said at least one local oxidation of silicon (LOCOS) isolation forming comprises forming said at least one LOCOS isolation to comprise a LOCOS oxide, and wherein said at least one local oxidation of silicon (LOCOS) isolation forming comprises forming said at least one LOCOS isolation at a temperature of approximately 1050° C., wherein each said at least one shallow trench isolation (STI) forming comprises insulating each said at least one periphery stack from one another, and wherein each said at least one local oxidation of silicon (LOCOS) isolation forming comprises insulating each said at least one core stack from one another.

* * * * *